United States Patent [19]
Aoki et al.

[11] Patent Number: 6,008,093
[45] Date of Patent: Dec. 28, 1999

[54] METHOD OF MAKING A MASK ROM

[75] Inventors: Hitoshi Aoki, Kasaoka; Masatomo Higuchi, Yamatokooriyama; Keiji Terayama, Kasaoka, all of Japan

[73] Assignee: Sharp Kabushiki Kaisha, Osaka, Japan

[21] Appl. No.: 09/002,706

[22] Filed: Jan. 5, 1998

[30] Foreign Application Priority Data

Feb. 3, 1997 [JP] Japan ............................ 9-020771

[51] Int. Cl.⁶ .............................................. H01L 21/8246
[52] U.S. Cl. ................................. 438/276; 438/130
[58] Field of Search .................................... 438/130, 275, 438/276, 277, 278, 282

[56] References Cited

U.S. PATENT DOCUMENTS

| | | | |
|---|---|---|---|
| 5,278,078 | 1/1994 | Kanebako et al. | 438/276 |
| 5,773,336 | 6/1998 | Gu | 438/276 |
| 5,866,456 | 2/1999 | Abe | 438/275 |

FOREIGN PATENT DOCUMENTS

| | | |
|---|---|---|
| 53-41188 | 4/1978 | Japan . |
| 63-131568 | 6/1988 | Japan . |
| 1-109763 | 4/1989 | Japan . |
| 2-296339 | 12/1990 | Japan . |
| 2-296366 | 12/1990 | Japan . |

*Primary Examiner*—Chandra Chaudhari
*Attorney, Agent, or Firm*—Nixon & Vanderhye, P.C.

[57] ABSTRACT

A semiconductor device fabrication method is provided which comprises the steps of: (i) forming a plurality of high concentration diffusion layers of a second conductivity in a semiconductor substrate; (ii) forming a plurality of first gate electrodes extending perpendicularly to the high concentration diffusion layers of the second conductivity on the semiconductor substrate with a first gate insulating film interposed therebetween; (iii) implanting ions of a first conductivity into surface portions of the semiconductor substrate for device isolation by using the first gate electrodes as a mask; (iv) forming side wall spacers on side walls of the first gate electrodes; (v-i) implanting ions of the second conductivity into surface portions of the semiconductor substrate for formation of channel regions by using the first gate electrodes and the side wall spacers as a mask; (vi-i) forming a plurality of second gate electrodes on the ion-implanted channel regions between the first gate electrodes; and (vii) implanting ions of the first conductivity again into surface portions of the semiconductor substrate by using the first gate electrodes and the second gate electrodes as a mask for device isolation.

19 Claims, 9 Drawing Sheets

METHOD OF MAKING A MASK ROM

CROSS-REFERENCE TO RELATED APPLICATIONS

This application is related to Japanese applications No. Hei 9(1997)-20771, filed on Feb. 3, 1997 whose priority is claimed under 35 USC §119, the disclosure of which is incorporated by reference in its entirety.

BACKGROUND OF THE INVENTION

1. Field of the Invention

The present invention relates to a semiconductor device and a fabrication method therefor and, more particularly, to a semiconductor device having a highly dense mask programmable ROM portion of a dual poly-gate structure and a fabrication method therefor.

2. Description of the Prior Art

Exemplary mask ROM memory cells include a NAND ROM in which ROM data writing is achieved by selectively forming enhancement type cell transistors and depression type cell transistors to be connected in series, and a NOR ROM in which ROM data writing is achieved by selectively setting the threshold voltages of cell transistors connected in parallel at a level higher than a source voltage. In general, the NAND ROM is superior in integration density and inferior in operation speed, whereas the NOR ROM is superior in operation speed and inferior in integration density.

In view of this, a high density NOR ROM memory cell has been proposed which features both a high integration density and a high operation speed.

Figure 17A:
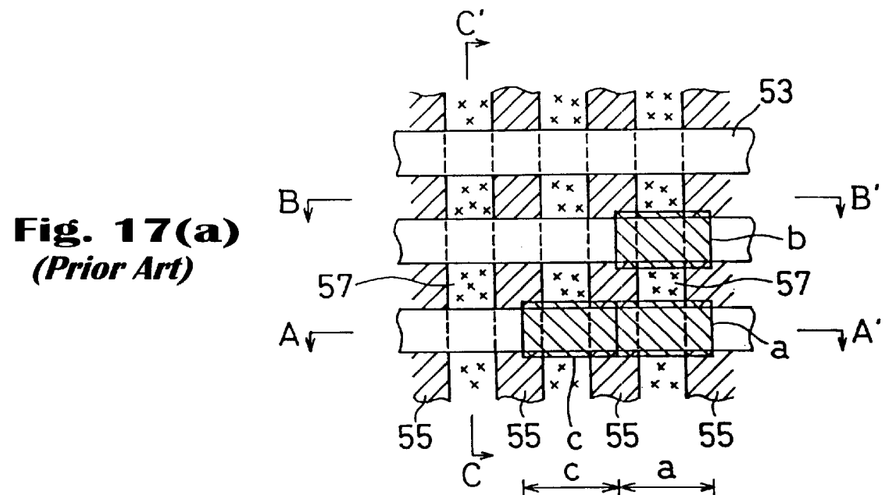
FIGS. 17(a) and FIG. 17(b) to FIG. 17(d) are a schematic plan view and schematic sectional views, respectively, illustrating a prior art semiconductor device.
Figure 17B:
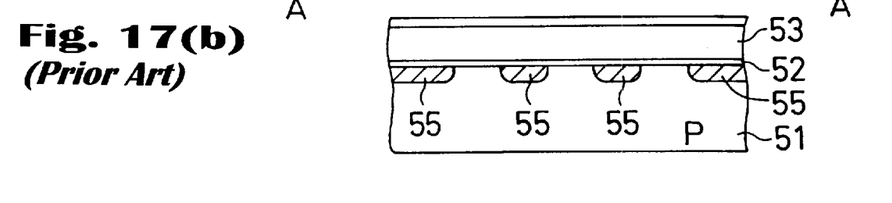
Figure 17C:
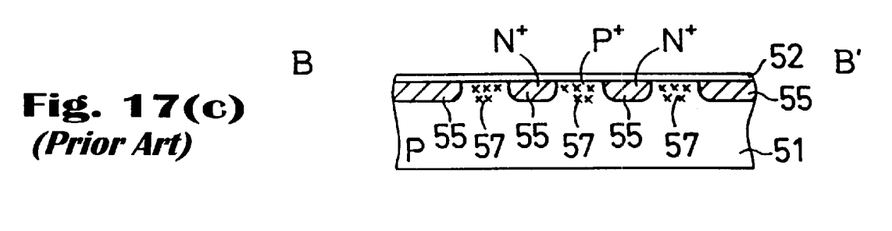
Figure 17D:
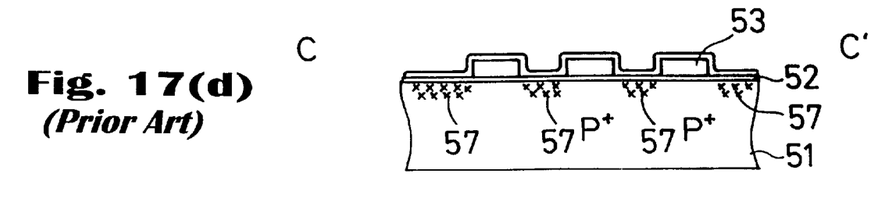

As shown in FIG. 17(a), the NOR ROM memory cell has a plurality of high concentration diffusion regions 55 provided in a parallel relation within a memory cell region having no device isolation film on a semiconductor substrate 51 and-serving as source/drain regions for cell transistors a, b and c and as bit line interconnections. The cell further has a plurality of gate electrodes (word lines) 53 formed on the semiconductor substrate 51 with intervention of a gate insulating film 52 and extending parallel to each other and perpendicularly to the high concentration diffusion regions 55. Device isolation regions 57 formed by implanting impurity ions of a conductivity different from that of the source/drain regions are provided in areas formed with neither the gate electrodes 53 nor the high concentration diffusion regions 55.

With this arrangement, the integration density in the memory cell region can be increased by reducing pitches of the high concentration diffusion regions 55 and the gate electrodes 53 to a level smaller than a conventional processibility limit, because the cell is free from steps which may otherwise be formed by the provision of a device isolation film. The device isolation is not achieved by the provision of the device isolation film but by self-aligned ion implantation after the formation of the gate electrodes 53. This also contributes to a higher integration density.

Further, a high density NOR ROM and NAND ROM have been proposed in which the integration density of memory cells is increased by employing a multi-gate structure which has a plurality of types of gate electrodes. For example, memory cells employing the multi-gate structure for a NAND ROM and for a highly dense NOR ROM are disclosed in Japanese Unexamined Patent Publications No. Sho 53(1978)-41188 and No. Sho 63(1988)-131568, respectively.

However, the high density NOR ROM memory cells employing the multi-gate structure have a difficulty in isolating the memory cells from each other.

In the case of conventional memory cells employing single-gate structure, the device isolation is achieved by implanting ions having the same conductivity as that of the substrate into areas where no gate electrode is formed after formation of the gate electrodes to increase the impurity concentration in the areas. In the case of memory cells employing dual-gate structure, however, the device isolation cannot properly be accomplished in the same manner as in the case of the memory cells of the single-gate structure, because ions cannot be implanted into an area where first gate electrodes and second gate electrodes are overlapped. As a result, a leak current between the memory cells is increased thereby to cause an operation failure.

To cope with this problem, Japanese Unexamined Patent Publications No. Hei 2(1990)-296339 and No. Hei 2(1990)-296366 propose methods of forming a device isolation region in an area where a first gate electrode and a second gate electrode are overlapped.

Figure 18A:
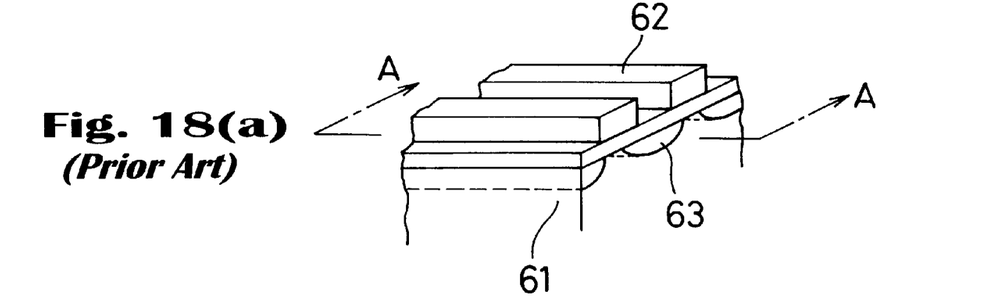
FIGS. 18(a) to FIG. 18(e) are schematic process diagrams for explaining one method of fabricating the prior art semiconductor device.
Figure 18B:
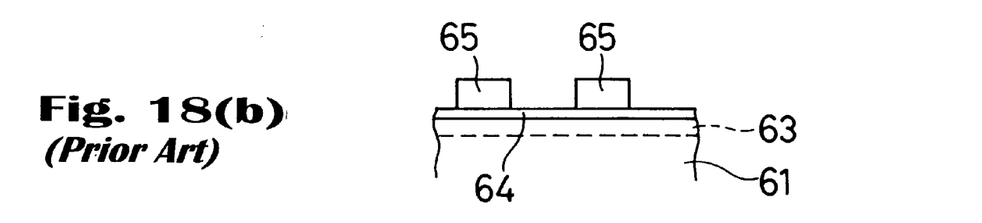
Figure 18C:
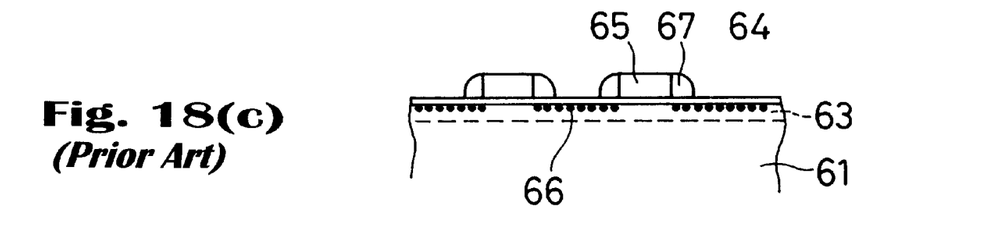
Figure 18D:
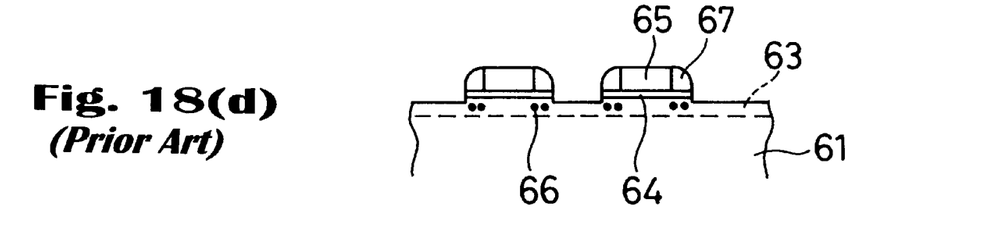

In accordance with Japanese Unexamined Patent Publication No. Hei 2(1990)-296339, source/drain regions 63 are formed in a semiconductor substrate 61 with the use of a resist mask 62 (FIG. 18(a)), and then first gate electrodes 65 each extending perpendicularly to the source/drain regions 63 are formed on the substrate 61 with a gate insulating film 64 interposed therebetween (FIG. 18(b)). Thereafter, ions 66 are implanted over the resulting substrate 61 with the use of the first gate electrodes 65 as a mask, and then side wall spacers 67 are formed on side walls of the first gate electrodes 65 (FIG. 18(c)). In turn, ion-implanted surface portions of the substrate 61 masked with the first gate electrodes 65 and the side wall spacers 67 are etched away (FIG. 18(d)), and then gate insulating films 68, second gate electrodes 69 and an interlayer insulating film 70 are formed on the resulting substrate (FIG. 18(e)).

Figure 18E:
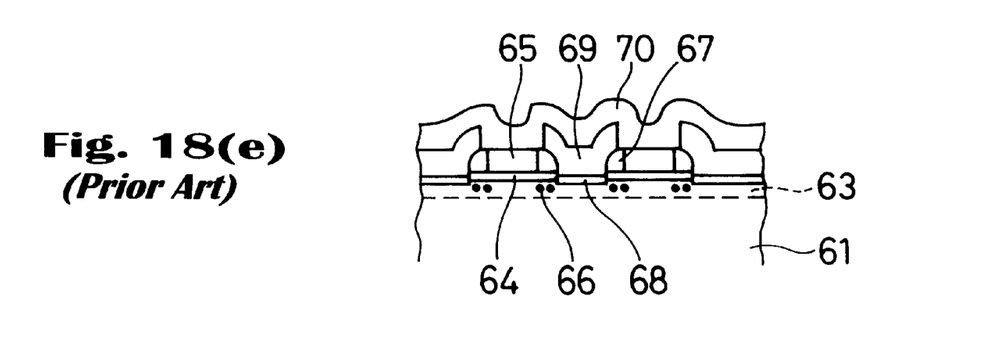

In this method, however, the etching of the substrate 61 for the formation of the second gate electrodes 69 result in greater steps, thereby making it difficult to properly perform the subsequent processing. Further, surface portions of the substrate later serving as channel regions below the second gate electrodes 69 are subjected to the etching, resulting in deterioration of the gate insulating films 68 due to an etching damage and in variations in the impurity concentration in the channel regions due to variations in the etching degree. This increases variations in the transistor characteristics thereby to adversely influence the device operation.

Figure 19A:
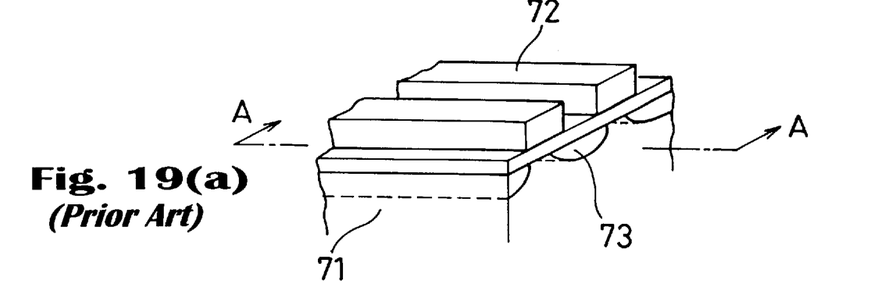
FIGS. 19(a) to FIG. 19(e) are schematic process diagrams for explaining another method of fabricating the prior art semiconductor device.
Figure 19B:
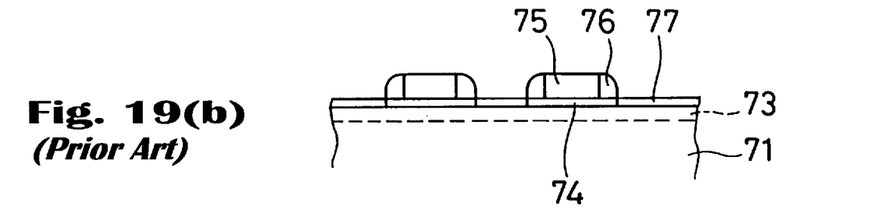
Figure 19C:
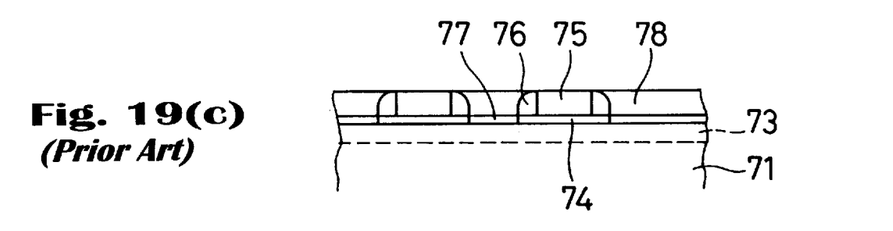

In accordance with Japanese Unexamined Patent Publication No. Hei 2(1990)-296366, source/drain regions 73 are formed in a semiconductor substrate 71 with the use of a resist mask 72 (FIG. 19(a)). In turn, first gate electrodes 75 each extending perpendicularly to the source/drain regions 73 are formed on the substrate 71 with a gate insulating film 74 interposed therebetween, and then side wall spacers 76 and second gate insulating film 77 are formed (FIG. 19(b)). Thereafter, a second gate electrode material is deposited over the resulting substrate 71, and etched back to form second gate electrodes 78 between the first gate electrodes 75 (FIG. 19(c)). Subsequently, the side wall spacers 76 are removed by way of wet etching, and ions 79 are implanted into surface portions of the substrate 71 between the first gate electrodes 75 and the second gate electrodes 78 in a self-aligned manner for device isolation (FIG. 19(d)). Then, an interlayer insulating film 80 is formed on the resulting substrate (FIG. 19(e)).

Figure 19D:
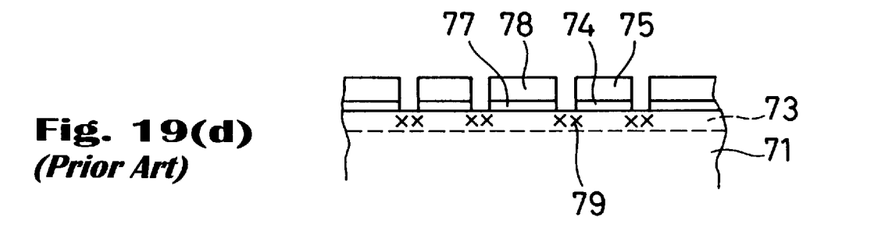
Figure 19E:
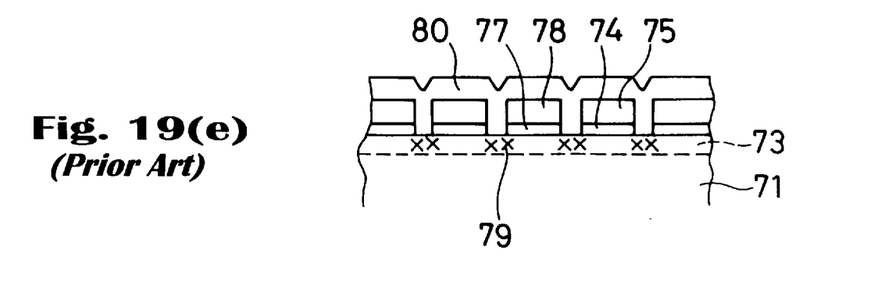

In this method, however, it is difficult to control the wet etching of the side wall spacers 76 between the first gate electrodes 75 and the second gate electrodes 78. Accordingly, there is a possibility that the gate insulating films 74 an 77 are also etched, thereby presenting a problem associated with a gate breakdown voltage. Further, portions of the side wall spacers 76 remaining between the first gate electrodes 75 and the second gate electrodes 78 after the etching have thickness variations. This leads to variations in the concentration of the ions implanted into the substrate for the device isolation, thereby making the device isolation characteristics unstable.

As apparent from the foregoing, semiconductor devices and fabrication methods therefor which ensure both a higher integration density of memory cells and the reliable device isolation have not been realized yet.

SUMMARY OF THE INVENTION

In accordance with one aspect of the present invention, there is provided a method of fabricating a semiconductor device, which comprises the steps of: (i) forming a plurality of high concentration diffusion layers of a second conductivity in a semiconductor substrate; (ii) forming a plurality of first gate electrodes extending perpendicularly to the high concentration diffusion layers of the second conductivity on the semiconductor substrate with a first gate insulating film interposed therebetween; (iii) implanting ions of a first conductivity into surface portions of the semiconductor substrate for device isolation by using the first gate electrodes as a mask; (iv) forming side wall spacers on side walls of the first gate electrodes; (v-i) implanting ions of the second conductivity into surface portions of the semiconductor substrate for formation of channel regions by using the first gate electrodes and the side wall spacers as a mask; (vi-i) forming a plurality of second gate electrodes on the ion-implanted channel regions between the first gate electrodes; (vii) implanting ions of the first conductivity again into surface portions of the semiconductor substrate for device isolation by using the first gate electrodes and the second gate electrodes as a mask.

There is provided another semiconductor device fabrication method which comprises: the aforesaid steps (i) to (v-i); the step of (v-ii) forming a mask having openings at least in ROM data writing areas below the first gate electrodes or second gate electrodes to be formed in the subsequent step and in device isolation region formation areas, and implanting ions of the first conductivity into surface portions of the semiconductor substrate for ROM data writing and for device isolation with the use of the mask; and the aforesaid step (iv-i).

There is provided still another semiconductor device fabrication method which comprises the aforesaid steps (i) to (vi-i); and the step of (vi-ii) forming a mask having openings at least in ROM data writing areas below the first gate electrodes or the second gate electrodes and in device isolation region formation areas, and implanting ions of the first conductivity into surface portions of the semiconductor substrate for ROM data writing and for device isolation with the use of the mask.

In accordance with another aspect of the present invention, there is provided a semiconductor device which comprises: a plurality of high concentration diffusion layers of a second conductivity formed in a parallel relation in a semiconductor substrate; a plurality of first gate electrodes formed on the semiconductor substrate with intervention of a first gate insulating film and extending parallel to each other and perpendicularly to the high concentration diffusion layers of the second conductivity; and a plurality of second gate electrodes formed between the first gate electrodes on the semiconductor substrate with intervention of a second insulating film; at least one of the first gate electrodes and the second gate electrodes serving as a device isolation gate electrode for preventing conduction between cells.

In accordance with still another aspect of the present invention, there is provided a semiconductor device which comprises: a plurality of high concentration diffusion layers of a second conductivity formed in a parallel relation in a semiconductor substrate; a plurality of first gate electrodes formed on the semiconductor substrate with intervention of a first gate insulating film and extending parallel to each other and perpendicularly to the high concentration diffusion layers of the second conductivity; and a plurality of second gate electrodes formed between the first gate electrodes on the semiconductor substrate with intervention of a second gate insulating film; wherein a surface portion of the semiconductor substrate located adjacent to the high concentration diffusion layers and not formed with the high concentration diffusion layers is covered with at least one of the first gate electrodes and the second gate electrodes, and a device isolation region formed by ion implantation performed simultaneously with ion implantation for ROM data writing or by formation of a LOCOS isolation film is provided in association with ends of ends of the high concentration diffusion layers for isolation thereof.

DETAILED DESCRIPTION OF THE PREFERRED EMBODIMENTS

In the semiconductor device fabrication method according to the present invention, a plurality of high concentration diffusion layers of a second conductivity are formed in a semiconductor substrate in the step (i). The semiconductor substrate herein used is not particularly limited, but may be any of various semiconductor substrates commonly used for formation of semiconductor devices. The semiconductor substrate may entirely be doped with an impurity of a first conductivity, or may have at least one or more wells of the first conductivity or the second conductivity formed in particular regions therein. Not only the semiconductor device of the present invention but also circuits such as memories of other types and peripheral circuits may be formed on the semiconductor substrate as desired. Further, LOCOS films for device isolation may be formed in desired regions on the semiconductor substrate.

For the formation of the plurality of high concentration diffusion layers of the second conductivity, a mask having openings on desired portions of the semiconductor substrate is first formed on the semiconductor substrate by a known method, and then ions of a conductivity opposite to that of the semiconductor substrate or the wells formed in the semiconductor substrate are implanted into the semiconductor substrate with the use of the mask. For example, arsenic ions or phosphorus ions are implanted into the semiconductor substrate in a dose of $1 \times 10^{15} cm^{-2}$ to $5 \times 10^{15} cm^{-2}$ at an implantation energy of about 10 keV to about 100 keV. After the ion implantation, the semiconductor substrate may optionally be subjected to a heat treatment. Here, high concentration diffusion layers can be formed rectangular and parallel to each other.

In the step (ii), a plurality of first gate electrodes extending perpendicularly to the high concentration diffusion layers of the second conductivity are formed on the resulting substrate with intervention of a first insulating film. More specifically, an $SiO_2$ or SiN insulating film having a desired thickness is formed as the first insulating film on the semiconductor substrate, and then a gate electrode material is deposited over the resulting substrate. Then, the deposited gate electrode material is patterned into a desired configuration to form the first gate electrodes extending parallel to each other. Examples of the gate electrode material include $N^+$ polysilicons, silicides of high melting point metals such as Ta, Ti and W, and polycides of such silicides. The gate electrode material is deposited to a thickness of about 2,000 Å to about 3,000 Å by a known method such as a CVD method.

In the step (iii), ions are implanted into surface portions of the semiconductor substrate for device isolation by using the first gate electrodes as a mask. For this ion implantation, a mask pattern may additionally be formed of a resist to cover regions unnecessary to be ion-implanted for the device isolation, and the mask pattern as well as the first gate electrodes may be used as the mask for the ion implantation. The ions to be implanted are of a conductivity opposite to that of the high concentration diffusion layers previously formed. For example, boron ions are implanted in a dose of the order of $10^{12} cm^{-2}$ to $10^{14} cm^{-2}$ at an implantation energy of about 10 keV to about 50 keV.

In the step (iv), side wall spacers are formed on side walls of the first gate electrodes. The formation of the side wall spacers is achieved by a known method, e.g., by first forming an insulating film over the resulting semiconductor substrate and then anisotropically etching the insulating film. The insulating film may preliminarily be formed to cover the first gate electrodes in the step (ii). The insulating film ensures isolation of the first gate electrodes from second gate electrodes to be formed in a later step, and serves as a mask for ion implantation and etching.

In the step (v-i), ions of the second conductivity are implanted into surface portions of the semiconductor substrate for formation of channel regions by using the first gate electrodes and the side wall spacers as a mask. This ion implantation for the channel formation cancels out the ions previously implanted for the device isolation so as to allow the substrate portions of the semiconductor substrate below the second gate electrodes to function as the channel regions. The dose and implantation energy for the ion implantation may properly be controlled. For example, ions of a conductivity opposite to that of the ions used for the ion implantation for the device isolation are implanted in a dose of the order of $10^{12} cm^{-2}$ to $10^{14} cm^{-2}$ at an implantation energy of about 10 keV to about 50 keV. The ion implantation for the channel formation allows only surface portions of the semiconductor substrate under the side wall spacers to contain the impurity in a concentration high enough to ensure a sufficient device isolation breakdown voltage. The ion implantation may employ a mask to implant the ions only into desired regions, or employ no mask to implant the ions over the entire substrate.

In the step (vi-i), the second gate electrodes are formed. The formation of the second gate electrodes is achieved, for example, by ordinary photolithography and dry etching processes. Alternatively, the formation of the second gate electrodes may be achieved by first forming a second insulating film over the resulting semiconductor substrate, then depositing a second gate electrode material thereon, and etching back the material. The formation of the second gate insulating film and the deposition of the second gate electrode material are achieved in the same manner as the formation of the first gate insulating film and the deposition of the first gate electrode material. In consideration that ROM data writing to areas below the first gate electrodes and ROM data writing to areas below the second gate electrodes in the semiconductor device of the present invention are simultaneously carried out in a later step, the materials for and the thicknesses of the first gate insulating film and the second gate insulating film are properly selected so that the first and second gate insulating films have ion implantation preventing abilities of the same level.

In the step (vii), ions are implanted into the semiconductor substrate again for device isolation by using the first and second gate electrodes as a mask. This ion implantation is performed in the same manner as the previous ion implantation for the device isolation. For this ion implantation, a mask pattern may additionally be formed of a resist to cover regions unnecessary to be ion-implanted for the device isolation, and the mask pattern as well as the first and second gate electrodes may be used as the mask.

After the aforesaid steps (i), (ii), (iii), (iv), (v-i), (vi-i) and (vii) are performed, an interlayer insulating film, contact holes, metal interconnections and a protective film are formed by known methods. Thus, the semiconductor device is completed. An ion implantation process for transistor Vth (threshold voltage) control, a device isolation process for peripheral circuitry and a mask ROM data writing process may be performed as required in any of the aforesaid steps. Where a CMOS semiconductor device is to be formed, a well formation process, a process for forming transistors of an opposite conductivity type may be performed in any of the aforesaid steps. The steps (i) through (vii) are not necessarily performed in the aforesaid order, but may be performed in a different order as required. Further, some of the steps may be performed simultaneously as a single step.

For example, the device isolation process and the mask ROM data writing process may be performed in a single step after the formation of the first gate electrodes before the formation of the second gate electrodes. In this case, the steps (i), (ii), (iii), (iv) and (v-i) are performed in the aforesaid manner, and the ion implantation for the device isolation and the ROM data writing to the areas below the first gate electrodes and the second gate electrodes to be later formed are performed in the step (v-ii). For the ion implantation for the data writing and the device isolation, any one of the following masks formed of a resist and the like is employed: a mask (1) having openings on data writing areas below the first gate electrodes and on device isolation region formation areas; a mask (2) having openings on data writing areas below the second gate electrodes and on the device isolation region formation areas; and a mask (3) having openings on the data writing areas below the first and second gate electrodes and on the device isolation region formation areas. Where either the mask (1) having openings on the data writing areas below the first gate electrodes and on the device isolation region formation areas or the mask (3) having openings on the data writing areas below the first and second gate electrodes and on the device isolation region formation areas is employed, ion implantation is preferably performed twice at different implantation energies with the use of the same mask. Exemplary ions to be used for the ion implantation include boron ions and $BF^{2+}$ ions. In a first ion implantation process, the ions are implanted directly into surface portions of the substrate in a dose of the order of $10^{12}cm^{-2}$ to $10^{14}cm^{-2}$ at an implantation energy of about 10 keV to about 50 keV. In a second ion implantation process, the ions are implanted through the first gate electrodes into surface portions of the substrate in a dose of the order of $10^{13}cm^{-2}$ to $10^{14}cm^{-2}$. The implantation energy for the second ion implantation is preferably such that the ions can penetrate the first gate electrodes to reach the surface portions of the substrate, for example, about 100 keV to about 200 keV. The first ion implantation process may either precede or follow the second ion implantation process. Where the mask (2) having openings on the data writing areas below the second gate electrodes and on the device isolation region formation areas is employed, ion implantation may be performed once. Exemplary ions to be used for this ion implantation include boron ions and $BF^{2+}$ ions. Conditions for the ion implantation is the same as the conditions for the aforesaid first ion implantation process.

Further, the device isolation process and the mask ROM data writing process may be performed in a single step after the formation of the first and second gate electrodes. In this case, the steps (i), (ii), (iii), (iv), (v-i) and (vi-i) are performed in the aforesaid manner, and the ion implantation for the device isolation and the ROM data writing to the areas below the first gate electrodes and the second gate electrodes are performed in the step (vi-ii). For the ion implantation for the data writing and the device isolation, any one of the following masks is employed like the aforesaid case: (1) a mask having openings on the data writing areas below the first gate electrodes and on the device isolation region formation areas; (2) a mask having openings on the data writing areas below the second gate electrodes and on the device isolation region formation areas; and (3) a mask having openings on the data writing areas below the first and second gate electrodes and on the device isolation region formation areas. Where any one of the masks (1) to (3) is used, ion implantation may be performed twice at different implantation energies with the use of the same mask. To shorten the turnaround time for semiconductor devices, the ion implantation for the data writing may be performed after the formation of an interlayer insulating film, after the formation of contact holes, or after the formation of metal interconnections.

The semiconductor device of the present invention comprises: a plurality of high concentration diffusion layers [of the second conductivity] formed in a parallel relation in a semiconductor substrate; a plurality of first gate electrodes formed on the semiconductor substrate with intervention of a first gate insulating film and extending parallel to each other and perpendicularly to the high concentration diffusion layers [of the second conductivity]; and a plurality of second gate electrodes formed between the first gate electrodes on the semiconductor substrate with intervention of a second insulating film; at least one of the first gate electrodes and the second gate electrodes serving as a device isolation gate electrode for preventing conduction between cells. The device isolation gate electrode has a potential such as to allow a parasitic transistor possibly formed in association with the device isolation gate electrode to be kept off, thereby serving for the device isolation. Where the semiconductor device of the present invention includes a memory cell portion and a selector portion for selecting a particular transistor in the memory cell portion, the device isolation gate electrode preferably serves for device isolation within a memory cell block, i.e., for device isolation between the memory cell portion and the selector portion.

Alternatively, the device isolation gate electrode may serve for device isolation between memory cell blocks, i.e., between a selector portion in one memory cell block and a selector portion in the other memory cell, or for device isolation between a memory cell portion and a peripheral circuit, i.e., in an outermost peripheral region of the memory cell portion. Where the peripheral circuit includes transistors of the same construction as in the memory cell portion, the device isolation gate electrode may be incorporated in the peripheral circuit. The aforesaid arrangements for the device isolation gate electrode are used alone or in combination.

In the semiconductor device of the present invention, device isolation regions may be formed in all areas requiring device isolation and located adjacent to ends of the high concentration diffusion layers below selection gates. In this case, the device isolation regions are preferably formed by ion implantation performed simultaneously with the ion implantation for the data writing or by formation of LOCOS isolation films.

The LOCOS isolation film may be formed by a known method, i.e., LOCOS method to a thickness of about 300 to 3000 nm on the semiconductor substrate previously.

Although the explanation to the semiconductor device and the fabrication method therefor according to the present invention is directed to a case where the semiconductor device has a dual-gate structure including the first and second gate electrodes, the present invention is applicable to a semiconductor device having multi-gate structure including three or more types of gate electrodes.

Embodiments of the semiconductor device and the fabrication method therefor will be explained with reference to the attached drawings. It should be understood that the present invention be not limited to these embodiments.
Embodiment 1

Figure 1:
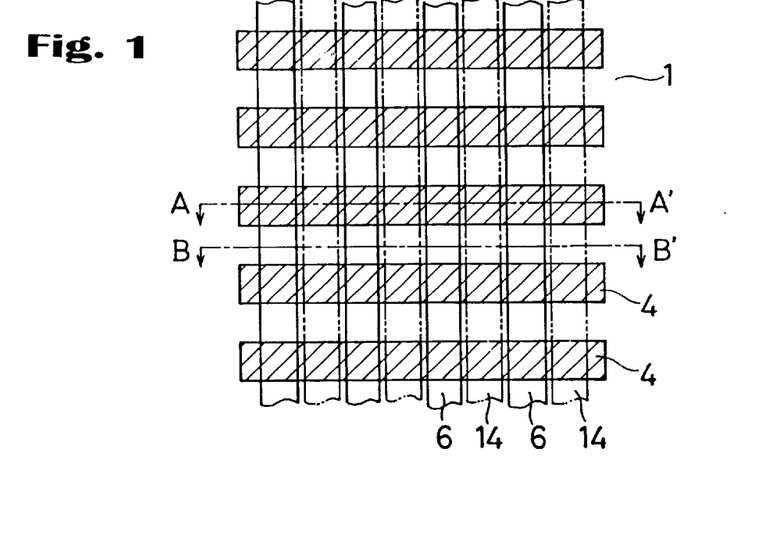
FIG. 1 is a schematic plan view illustrating major portions of one exemplary semiconductor device to be fabricated by a semiconductor device fabrication method according to the present invention.

As shown in a plan view of FIG. 1, a semiconductor device according to the present invention includes memory cells comprising a plurality of source/drain regions 4 formed as n-type high concentration diffusion layers in a semiconductor substrate 1 and extending parallel to each other, a plurality of first gate electrodes 6 formed on the semiconductor substrate 1 and extending generally perpendicularly to the source/drain regions 4 in a parallel spaced relation, and a plurality of second gate electrodes 14 formed between the first gate electrodes 6.

A method of fabricating the semiconductor device will be described with reference to FIGS. 2 to 8 which are sectional taken along a line A–A' or B–B' in FIG. 1.

Figure 2:
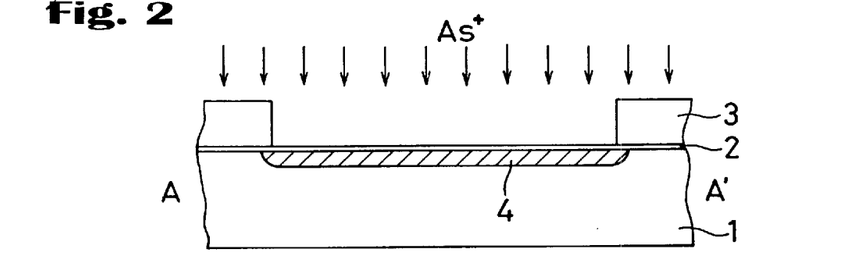
FIG. 2 is a schematic sectional view taken along a line A–A' in FIG. 1 for explaining one method of fabricating the semiconductor device of FIG. 1.

As shown in FIG. 2, a resist pattern 3 having a desired configuration is formed on a p-type semiconductor substrate 1 having an insulating film 2 formed on a surface thereof and, for example, arsenic ions are implanted into the semiconductor substrate 1 in a dose of the order of $10^{15}cm^{-2}$ at an implantation energy of 40 keV with the use of the resist pattern 3 as a mask for formation of source/drain regions 4 as high concentration diffusion layers.

Figure 3A:
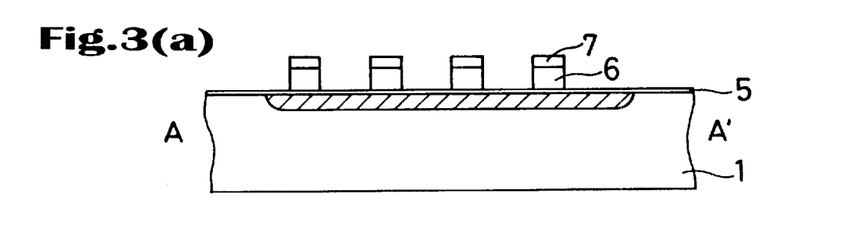
FIG. 3(a) and FIG. 3(b) are schematic sectional views taken along lines A–A' and B–B', respectively, in FIG. 1 for explaining the method of fabricating the semiconductor device of FIG. 1.
Figure 3B:
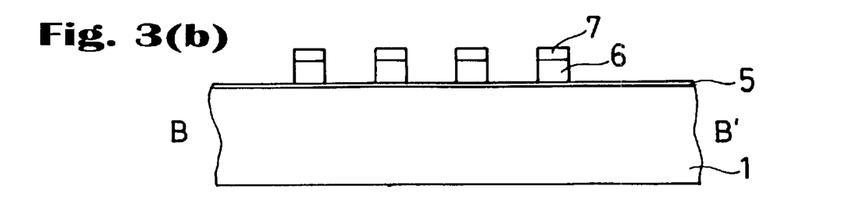

As shown in FIGS. 3(a) and 3(b), a first gate insulating film 5 having a thickness of about 50 Å to about 300 Å is formed on the semiconductor substrate 1 after removal of the insulating film 2, and a plurality of first gate electrodes 6 having a thickness of about 2,000 Å to about 3,000 Å and extending parallel to each other and generally perpendicularly to the source/drain regions 4 are formed of a N$^+$ polysilicon on the first gate insulating film 5. Insulating films 7 serving as interlayer insulating films for insulating the first gate electrodes from second gate electrodes to be formed in a later step are formed on the first gate electrodes 6.

Figure 4:
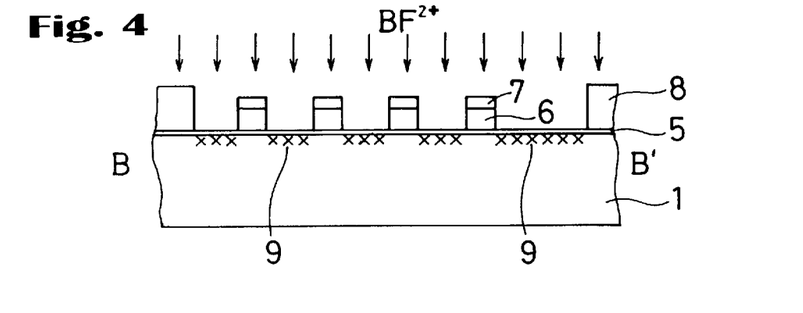
FIG. 4 to FIG. 8 are schematic sectional views taken along the line B–B' in FIG. 1 for explaining the method of fabricating the semiconductor device of FIG. 1.

In turn, as shown in FIG. 4, a resist pattern 8 as a mask for ion implantation for memory cell isolation is formed on the resulting substrate, and ions of the same conductivity as that of the semiconductor substrate 1, e.g., BF$^{2+}$ ions, are implanted into surface portions of the semiconductor substrate 1 in a dose of the order of $10^{12}cm^{-2}$ to $10^{13}cm^{-2}$ at an implantation energy of 30 keV to form device isolation regions 9 having a higher impurity concentration in the semiconductor substrate 1.

Figure 5:
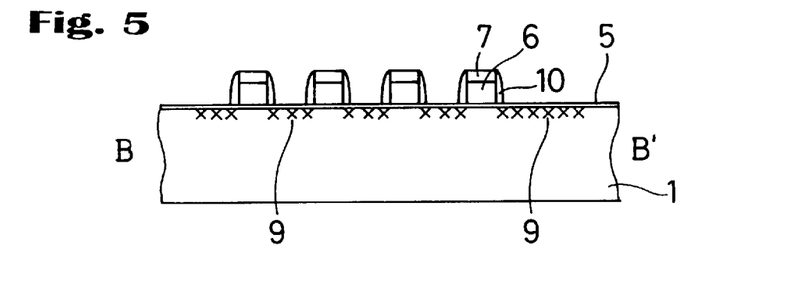

Thereafter, as shown in FIG. 5, side wall spacers 10 are formed on side walls of the first gate electrodes 6 and the insulating films 7. These side wall spacers 10 also serve as interlayer insulating films for insulating the first gate electrodes 6 from the second gate electrodes to be formed in the later step.

Figure 6:
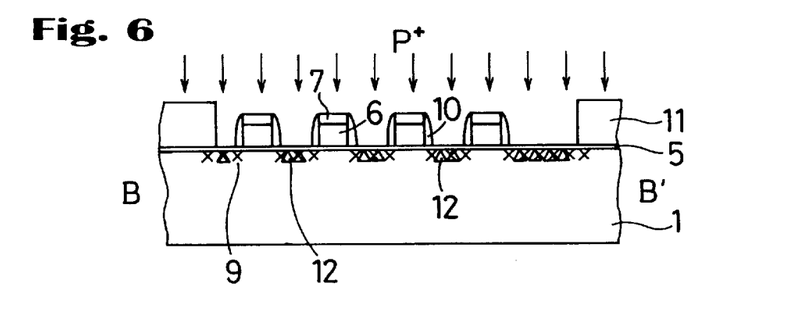

In turn, as shown in FIG. 6, a resist pattern 11 as a mask for ion implantation for formation of channel regions in the memory cells is formed on the resulting substrate, and ions of a conductivity opposite to that of the semiconductor substrate 1, e.g., P$^+$ ions, are implanted into surface portions 12 of the semiconductor substrate 1 later serving as channel regions under the second gate electrodes in a dose of the order of $10^{12}cm^{-2}$ to $10^{13}cm^{-2}$ at an implantation energy of 30 keV for counter doping. The counter doping allows the impurity previously implanted into the device isolation regions 9 to be canceled out by the impurity implanted into the surface portions 12 later serving as the channel regions, so that the impurity concentration in the surface portions 12 is properly controlled. Thus, only regions under the side wall spacers 10 have a high impurity concentration to ensure a sufficiently high device isolation withstand voltage.

Figure 7:
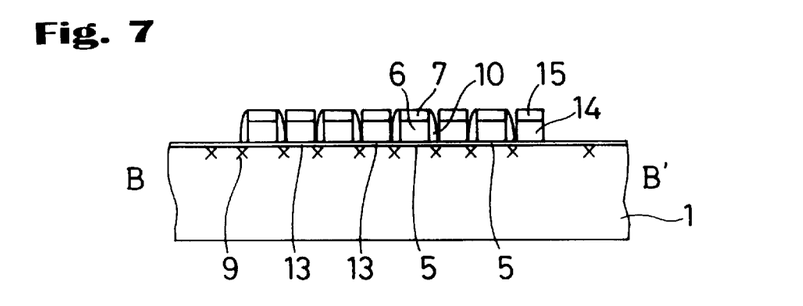

As shown in FIG. 7, second gate insulating films 13 are formed on the surface portions 12 later serving as the channel regions, and then the second gate electrodes 14 having a thickness of 2,000 Å to 3,000 Å are formed of a N$^+$ polysilicon between the first gate electrodes 6. Insulating films 15 serving as interlayer insulating films for insulating the second gate electrodes 14 from metal interconnections to be formed in a later step are formed on the second gate electrodes 14.

In turn, a second device isolation ion implantation step is performed. More specifically, as shown in FIG. 8, a resist pattern 16 as a mask for ion implantation for memory cell isolation is formed again on the resulting substrate, and ions of the same conductivity as that of the semiconductor substrate 1, e.g., BF$^{2+}$ ions, are implanted in a dose of the order of $10^{12}cm^{-2}$ to $10^{13}cm^{-2}$ at an implantation energy of 30 keV to form device isolation regions 17 having a higher impurity concentration in the semiconductor substrate 1.

Thereafter, the semi-processed semiconductor device is subjected to an interlayer insulating film formation step, a contact hole formation step, a metal interconnection formation step, a protection film formation step and the like for completion of the first half of the semiconductor fabrication process, and further subjected to an assembling step for completion of the second half of the semiconductor fabrication process. Thus, the semiconductor device is completed.
Embodiment 2

A mask ROM employing the semiconductor device of the present invention will be described.

Figure 8:
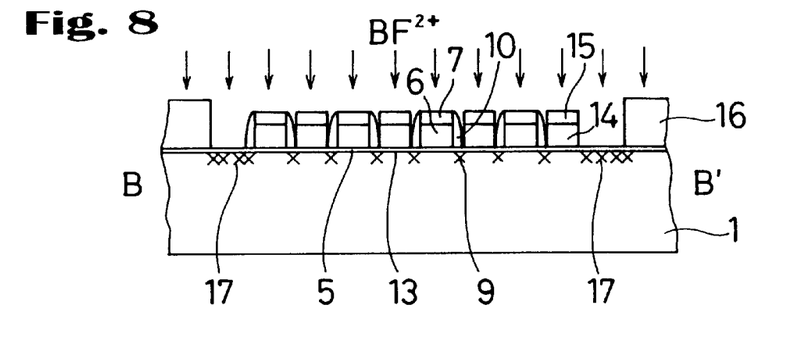

In this embodiment, the second device isolation ion implantation step shown in FIG. 8 is dispensed with by performing the second device isolation ion implantation and the ion implantation for first ROM data writing in a single step, thereby simplifying the fabrication process.

Figure 9:
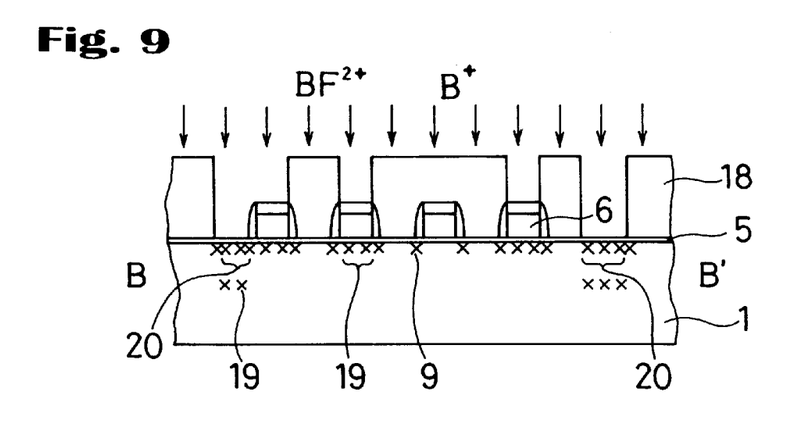
FIG. 9 is a schematic sectional view taken along the line B–B' in FIG. 1 for explaining another method of fabricating the semiconductor device of FIG. 1.

After the step shown in FIG. 6, the second device isolation ion implantation and the ion implantation for the ROM data writing to first cell transistors having the first gate electrodes are performed, as shown in FIG. 9, before the formation of the second gate electrodes. More specifically, a resist pattern 18 having openings in regions where the ion implantation for the ROM data writing to the first cell transistors and the cell isolation ion implantation are to be performed is formed on the resulting substrate. The ion implantation for the ROM data writing to the first cell transistors is performed with the use of the resist pattern 18 as a mask. At this time, B$^+$ ions 19 are implanted into channel regions of selected first cell transistors through the corresponding first gate electrodes 6 in a dose of the order of $10^{13}cm^{-2}$ to $10^{14}$ cm$^{-2}$ at a relatively high implantation energy, e.g., 120 keV, which allows the ions to penetrate the first gate electrodes, for the ROM data writing to the first cell transistors. In turn, BF$^{2+}$ ions are implanted into surface portions of the substrate later serving as the device isolation regions in a dose of the order of $10^{12}cm^{-2}$ to $10^{13}cm^{-2}$ at a relatively low implantation energy, e.g., 30 keV, which does not allow the ions to penetrate the first gate electrodes, for formation of the device isolation regions 20.

Thus, the number of photolithography processes is reduced by one.

In turn, the second gate electrodes 14 are formed in the same manner as in Embodiment 1 as shown in FIG. 7.

Thereafter, the semi-processed semiconductor device is subjected to an interlayer insulating film formation step, a contact hole formation step, a metal interconnection formation step, a protection film formation step and the like for completion of the first half of the semiconductor fabrication process, and further subjected to an assembling step for completion of the second half of the semiconductor fabrication process. Thus, the semiconductor device is completed.

Embodiment 3

A mask ROM employing the semiconductor device of the present invention will be described.

In this embodiment, the second device isolation ion implantation step shown in FIG. 8 is dispensed with by performing the second device isolation ion implantation and the ion implantation for second ROM data writing in a single step, thereby simplifying the fabrication process.

Figure 10:
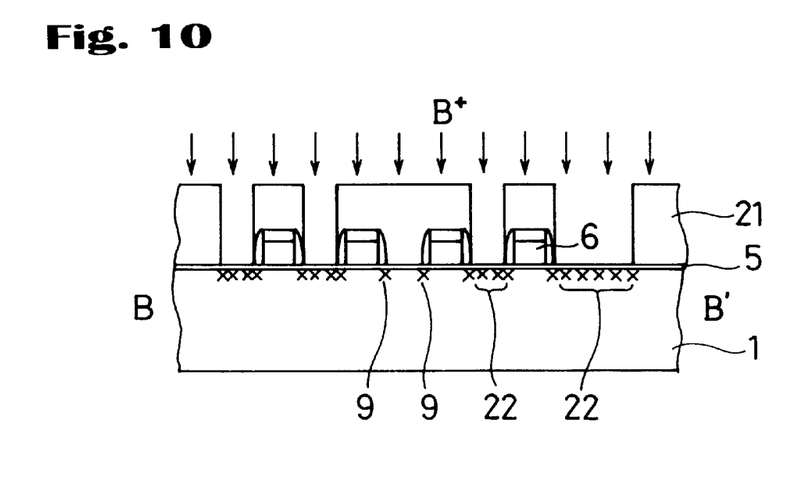
FIG. 10 is a schematic sectional view taken along the line B–B' in FIG. 1 for explaining still another method of fabricating the semiconductor device of FIG. 1.

After the step shown in FIG. 6, the second device isolation ion implantation and the ion implantation for the ROM data writing to second cell transistors having the second gate electrodes to be formed in a later step are simultaneously performed, as shown in FIG. 10, before the formation of the second gate electrodes. More specifically, a resist pattern 21 having openings in regions where the ion implantation for the ROM data writing to the second cell transistors and the cell isolation ion implantation are to be performed is formed on the resulting substrate. The ion implantation for the ROM data writing to the second cell transistors is performed with the use of the resist pattern 21 as a mask. At this time, B$^+$ ions 22 are implanted into surface portions of the semiconductor substrate corresponding to channel regions of selected second cell transistors in a dose of the order of $10^{13}$cm$^{-2}$ to $10^{14}$cm$^{-2}$ at a relatively low implantation energy, e.g., 20 keV, [which does not allow the ions to penetrate the gate electrodes,] for the ROM data writing to the second cell transistors. Simultaneously therewith, B$^+$ ions 22 are implanted into surface portions of the semiconductor substrate later serving as the device isolation regions.

Thus, the number of photolithography processes is reduced by one like Embodiment 2, and the number of ion implantation processes is reduced by one in comparison with Embodiment 2.

In turn, the second gate electrodes 14 are formed in the same manner as in Embodiment 1 as shown in FIG. 7. Thereafter, the semi-processed semiconductor device is subjected to an interlayer insulating film formation step, a contact hole formation step, a metal interconnection formation step, a protection film formation step and the like for completion of the first half of the semiconductor fabrication process, and further subjected to an assembling step for completion of the second half of the semiconductor fabrication process. Thus, the semiconductor device is completed.

Embodiment 4

A mask ROM employing the semiconductor device of the present invention will be described.

In this embodiment, the second device isolation ion implantation step shown in FIG. 8 is dispensed with by performing the second device isolation ion implantation, the ion implantation for the first ROM data writing and the ion implantation for the second ROM data writing in a single step, thereby simplifying the fabrication process.

Figure 11:
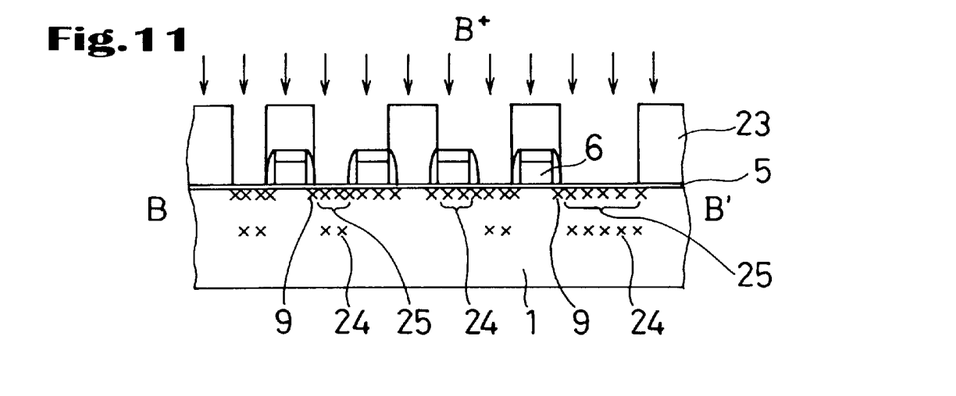
FIG. 11 is a schematic sectional view taken along the line B–B' in FIG. 1 for explaining further another method of fabricating the semiconductor device of FIG. 1.

After the step shown in FIG. 6, the second device isolation ion implantation, the ion implantation for the ROM data writing to first cell transistors having the first gate electrodes and the ion implantation for the ROM data writing to second cell transistors having the second gate electrodes to be formed in a later step are performed, as shown in FIG. 11, before the formation of the second gate electrodes. More specifically, a resist pattern 23 having openings in regions where the ion implantation for the ROM data writing to the first and second cell transistors and the cell isolation ion implantation are to be performed is formed on the resulting substrate. The ion implantation for the ROM data writing to the first and second cell transistors is performed with the use of the resist pattern 23 as a mask. At this time, B$^+$ ions 24 are implanted into channel regions of selected first cell transistors through the corresponding first gate electrodes 6 in a dose of the order of $10^{13}$cm$^{-2}$ to $10^{14}$cm$^{-2}$ at a relatively high implantation energy, e.g., 120 keV, which allows the ions to penetrate the first gate electrodes, for the ROM data writing to the first cell transistors. In turn, B$^+$ ions 25 are implanted into surface portions of the semiconductor substrate later serving as the device isolation regions and channel regions of selected second cell transistors in a dose of the order of $10^{13}$cm$^{-2}$ to $10^{14}$cm$^{-2}$ at a relatively low implantation energy, e.g., 20 keV, which does not allow the ions to penetrate the first gate electrodes, for the ROM data writing to the second cell transistors and for the formation of the device isolation regions. Since some of the ions implanted at a relatively high implantation energy not through the first gate electrodes reach a greater depth in the substrate, the second cell transistors which have channel regions adjacent to the surface of the substrate are not critically influenced by the high energy ion implantation.

Thus, the number of photolithography processes is reduced by one in comparison with Embodiment 3.

In turn, the second gate electrodes 14 are formed in the same manner as in Embodiment 1 as shown in FIG. 7. Thereafter, the semi-processed semiconductor device is subjected to an interlayer insulating film formation step, a contact hole formation step, a metal interconnection formation step, a protection film formation step and the like for completion of the first half of the semiconductor fabrication process, and further subjected to an assembling step for completion of the second half of the semiconductor fabrication process. Thus, the semiconductor device is completed.

Embodiment 5

A mask ROM employing the semiconductor device of the present invention will be described.

In this embodiment, the second device isolation ion implantation step shown in FIG. 8 is dispensed with by performing the second device isolation ion implantation and the ion implantation for the first ROM data writing in a single step, thereby simplifying the fabrication process. Further, the turnaround time is shortened by performing the ion implantation for the ROM data writing in the later step.

Figure 12:
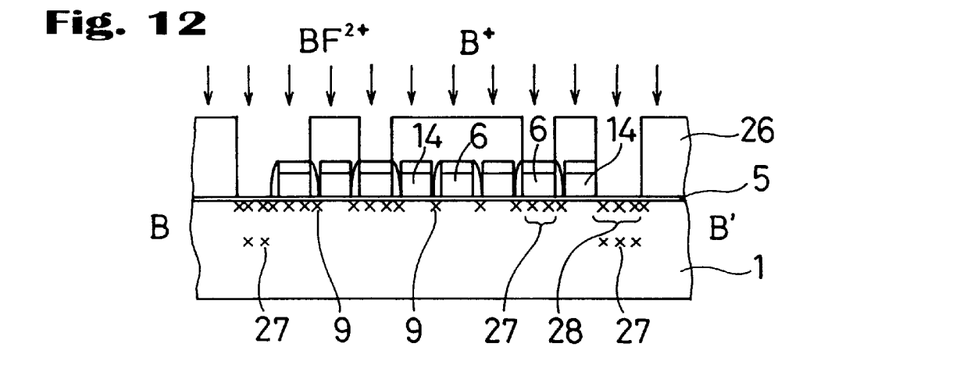
FIG. 12 is a schematic sectional view taken along the line B–B' in FIG. 1 for explaining still another method of fabricating the semiconductor device of FIG. 1.

As shown in FIG. 12, the second device isolation ion implantation and the ion implantation for the ROM data writing to first cell transistors having the first gate electrodes are performed after the formation of the second gate electrodes in the step shown in FIG. 7. More specifically, a resist pattern 26 having openings in regions where the ion implantation for the ROM data writing to the first cell transistors and the cell isolation ion implantation are to be performed is formed on the resulting substrate. The ion implantation for the ROM data writing to the first cell transistors is performed with the use of the resist pattern 26 as a mask. At this time, B$^+$ ions 27 are implanted into channel regions of selected first cell transistors through the corresponding first gate electrodes 6 in a dose of the order of $10^{13}$cm$^{-2}$ to $10^{14}$cm$^{-2}$ at a relatively high implantation energy, e.g., 120 keV, which allows the ions to penetrate the first gate electrodes, for the ROM data writing to the first cell transistors. In turn, $BF^{2+}$ ions 28 are implanted into surface portions of the semiconductor substrate corresponding to the device isolation regions in a dose of the order of $10^{12} cm^{-2}$ to $10^{13} cm^{-2}$ at a relatively low implantation energy, e.g., 30 keV, which does not allow the ions to penetrate the first gate electrode 6 [which allows the ions to penetrate neither the first gate electrodes 6 nor the second gate electrodes 14], for the formation of the device isolation regions. Even if gaps are formed between the first gate electrodes 6 and the second gate electrodes 14 due to variations in the gate electrode width or misalignment, the ions 28 are implanted into surface portions of the substrate between the first gate electrodes 6 and the second gate electrodes 14 in a self-aligned manner, so that a sufficiently high device isolation withstand voltage can be ensured. Further, the number of photolithography processes is reduced by one.

Thereafter, the semiconductor device is completed in the same manner as in Embodiment 1.

Embodiment 6

A mask ROM employing the semiconductor device of the present invention will be described.

In this embodiment, the second device isolation ion implantation step shown in FIG. 8 is dispensed with by performing the second device isolation ion implantation and the ion implantation for the second ROM data writing in a single step, thereby simplifying the fabrication process.

Figure 13:
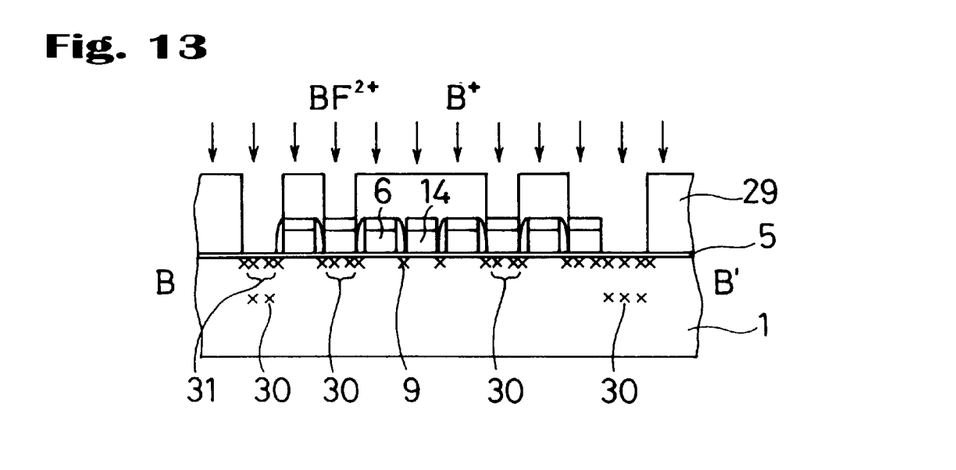
FIG. 13 is a schematic sectional view taken along the line B–B' in FIG. 1 for explaining further another method of fabricating the semiconductor device of FIG. 1.

As shown in FIG. 13, the second device isolation ion implantation and the ion implantation for the ROM data writing to second cell transistors having the second gate electrodes are performed after the formation of the second gate electrodes in the step shown in FIG. 7. More specifically, a resist pattern 29 having openings in regions where the ion implantation for the ROM data writing to the second cell transistors and the cell isolation ion implantation are to be performed is formed on the resulting substrate. The ion implantation for the ROM data writing to the second cell transistors is first performed with the use of the resist pattern 29 as a mask. At this time, $B^+$ ions 30 are implanted into channel regions of selected second cell transistors through the corresponding second gate electrodes 14 in a dose of the order of $10^{13} cm^{-2}$ to $10^{14} cm^{-2}$ at a relatively high implantation energy, e.g., 120 keV, which allows the ions to penetrate the second gate electrodes, for the ROM data writing to the second cell transistors. In turn, $BF^{2+}$ ions 31 are implanted into surface portions of the semiconductor substrate corresponding to the device isolation regions in a dose of the order of $10^{12} cm^{-2}$ to $10^{13} cm^{-2}$ at a relatively low implantation energy, e.g., 30 keV, which does not allow the ions to penetrate the second gate electrodes 14 [which allows the ions to penetrate neither the first gate electrodes 6 nor the second gate electrodes 14], for the formation of the device isolation regions.

Even if gaps are formed between the first gate electrodes 6 and the second gate electrodes 14 due to variations in the gate electrode width or misalignment, the ions 31 are implanted into surface portions of the substrate between the first gate electrodes and the second gate electrodes in a self-aligned manner, so that a sufficiently high device isolation withstand voltage can be ensured. Further, the number of photolithography processes is reduced by one.

Thereafter, the semiconductor device is completed in the same manner as in Embodiment 1.

Embodiment 7

A mask ROM employing the semiconductor device of the present invention will be described.

In this embodiment, the second device isolation ion implantation step shown in FIG. 8 is dispensed with by performing the second device isolation ion implantation, the ion implantation for the first ROM data writing and the ion implantation for the second ROM data writing in a single step, thereby simplifying the fabrication process.

Figure 14:
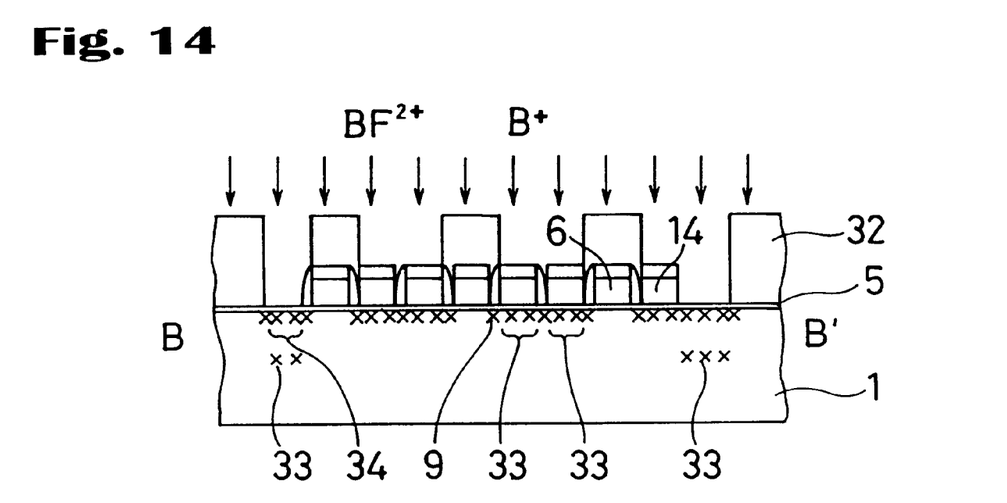
FIG. 14 is a schematic sectional view taken along the line B–B' in FIG. 1 for explaining still another method of fabricating the semiconductor device of FIG. 1.

As shown in FIG. 14, the second device isolation ion implantation, the ion implantation for the ROM data writing to first cell transistors having the first gate electrodes and the ion implantation for the ROM data writing to second cell transistors having the second gate electrodes are performed after the formation of the second gate electrodes in the step shown in FIG. 7. More specifically, a resist pattern 32 having openings in regions where the ion implantation for the ROM data writing to the first and second cell transistors and the cell isolation ion implantation are to be performed is formed on the resulting substrate. The ion implantation for the ROM data writing to the first and second cell transistors is performed with the use of the resist pattern 32 as a mask. At this time, $B^+$ ions 33 are implanted into channel regions of selected first cell transistors and channel regions of selected second cell transistors through the corresponding first gate electrodes 6 and second gate electrodes 14 in a dose of the order of $10^{13} cm^{-2}$ to $10^{14} cm^{-2}$ at a relatively high implantation energy, e.g., 120 keV, which allows the ions to penetrate the first and second gate electrodes, for the ROM data writing to the first and second cell transistors. In turn, $BF^{2+}$ ions 34 are implanted into surface portions of the semiconductor substrate corresponding to the device isolation regions in a dose of the order of $10^{12} cm^{-2}$ to $10^{13} cm^{-2}$ at a relatively low implantation energy, e.g., 30 keV, which allows the ions to penetrate neither the first gate electrodes 6 nor the second gate electrodes 14, for the formation of the device isolation regions.

Even if gaps are formed between the first gate electrodes 6 and the second gate electrodes 14 due to variations in the gate electrode width or misalignment, the ions 34 are implanted into surface portions of the substrate between the first gate electrodes and the second gate electrodes in a selfaligned manner, so that a sufficiently high device isolation withstand voltage can be ensured. Further, the number of photolithography processes is reduced by one in comparison with Embodiments 5 and 6.

Thereafter, the semiconductor device is completed in the same manner as in Embodiment 1. To further shorten the turnaround time, the aforesaid step may be performed after formation of an interlayer insulating film, after formation of contact holes or after formation of metal interconnections.

Embodiment 8

The semiconductor device of the present invention will be described by way of still another embodiment.

Figure 15:
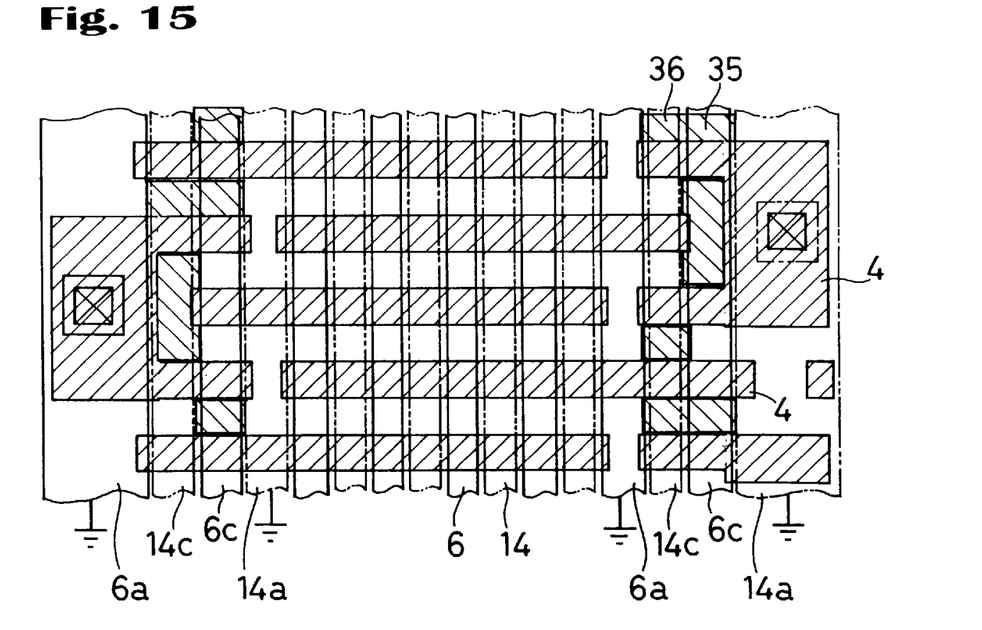
FIG. 15 is a schematic plan view illustrating another exemplary semiconductor device according to the present invention.

As shown in a plan view of FIG. 15, first gate electrodes 6 and second gate electrodes 14 each serving as a word line or a selection line of a memory cell are alternately arranged within a memory cell region with no gap therebetween. Source/drain regions 4 each serving as an auxiliary bit line extend perpendicularly to the word lines. The source/drain regions 4 each have opposite ends covered with a first gate electrode 6a or a second gate electrode 14a serving as a dummy word line for device isolation, and are not provided in regions where no gate electrode is present. The dummy word lines 6a and 14a each have a potential which allows parasitic transistors possibly formed in association with the dummy word lines 6a and 14a to be always kept off. Where this arrangement is applied to a mask ROM, ion implantation for formation of device isolation regions 35 and 36 below the selection lines 6c and 14c to which variable potentials are applied is performed simultaneously with the ion implantation for ROM data writing to selectively form OFF transistors.

With this arrangement, the second device isolation ion implantation step is dispensed with.

Although the formation of the device isolation regions may be achieved by formation of ordinary LOCOS insulating films, the aforesaid arrangement is more preferable to ensure more excellent planarization and easier processing.

Embodiment 9

The semiconductor device of the present invention will be described by way of further another embodiment.

Figure 16:
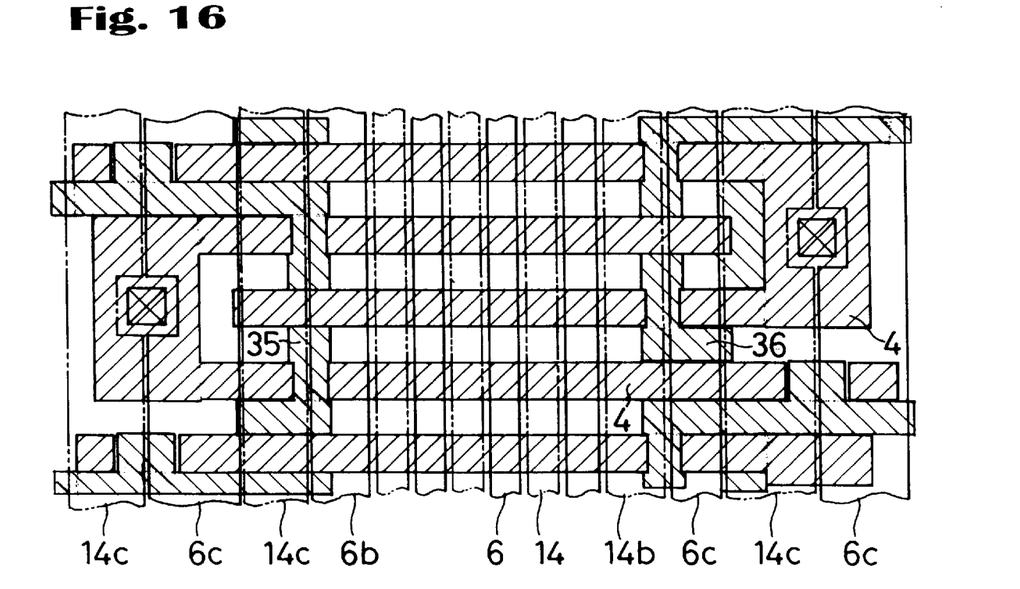
FIG. 16 is a schematic sectional view illustrating still another exemplary semiconductor device according to the present invention.

As shown in a plan view of FIG. 16, first gate electrodes 6 and second gate electrodes 14 each serving as a word line or a selection line of a memory cell are alternately arranged within a memory cell region with no gap therebetween. Source/drain regions 4 each serving as an auxiliary bit line extend perpendicularly to the word lines. The source/drain regions 4 each have opposite ends covered with first gate electrodes 6b or 6c or second gate electrodes 14b or 14c serving as the word lines or the selection lines, and are not formed in regions where no gate electrode is formed. Ion implantation for formation of device isolation regions 35 and 36 is performed simultaneously with ion implantation for ROM data writing to selectively form OFF transistors so that parasitic transistor regions possibly formed in association with the word lines 6b and 14b and the selection lines 6c and 14c are always kept off.

With this arrangement, the second device isolation ion implantation step is dispensed with.

Although the formation of the device isolation regions may be achieved by formation of ordinary LOCOS insulating films, the aforesaid arrangement is more preferable to ensure more excellent planarization and easier processing.

The semiconductor device fabrication method according to the present invention improves memory cell isolation characteristics in a highly dense semiconductor device which has a novel multi-gate memory cell structure employing two or more types of gate electrodes. Further, the fabrication method facilitates the formation of the second gate electrodes and improves the reliability of the gate insulating film. In addition, the fabrication method improves the stability of the memory cell characteristics and the cell isolation characteristics.

In the semiconductor device fabrication method, the ion implantation for the ROM data writing and the ion implantation for the formation of the device isolation regions in desired regions are performed in a single step, thereby reducing the number of process steps. That is, the fabrication method requires a reduced number of masking processes and photolithography processes, so that the production costs can be reduced. Further, the turnaround time for semiconductor devices can be shortened by properly controlling the implantation energy for the ion implantation processes.

With the semiconductor device according to the present invention, reliable memory cell isolation is achieve in a highly dense NOR ROM memory cell employing the multi-gate electrode structure. This allows for fabrication of a high capacity ROM with a reduced size, thereby reducing the production costs.

In addition, the semiconductor device fabrication method according to the present invention features an easier processing, an improved reliability of the gate insulating film, an improved stability of the memory cell characteristics, a simplified fabrication process and a shortened turnaround time for mask ROMs in comparison with the prior art fabrication method. This leads to an improved reliability of the semiconductor device, a reduced cost and an improved production efficiency.

What is claimed is:

1. A semiconductor device fabrication method, comprising the steps of:
   (i) forming a plurality of high concentration diffusion layers of a second conductivity in a semiconductor substrate;
   (ii) forming a plurality of first gate electrodes extending perpendicularly to the high concentration diffusion layers of the second conductivity on the semiconductor substrate with a first gate insulating film interposed therebetween;
   (iii) implanting ions of a first conductivity into surface portions of the semiconductor substrate for device isolation by using the first gate electrodes as a mask;
   (iv) forming side wall spacers on side walls of the first gate electrodes;
   (v-i) implanting ions of the second conductivity into surface portions of the semiconductor substrate for formation of channel regions by using the first gate electrodes and the side wall spacers as a mask;
   (vi-i) forming a plurality of second gate electrodes on the ion-implanted channel regions between the first gate electrodes with a second gate insulating film interposed therebetween; and
   (vii) implanting ions of the first conductivity again into surface portions of the semiconductor substrate for device isolation by using the first gate electrodes and the second gate electrodes as a mask.

2. A semiconductor device fabrication method of claim 1, wherein the high concentration diffusion layers are formed rectangular and parallel to each other in the step (i).

3. A semiconductor device fabrication method of claim 1, wherein a mask pattern which covers regions unnecessary to be ion-implanted is additional used as well as the first gate electrodes as a mask in the step (iii).

4. A semiconductor device fabrication method of claim 1, wherein the ion-implantation in the step (v-i) cancels out the ions of the first conductivity implanted for the device isolation in the step (iii) so as to function the surface portions of the semiconductor substrate as a channel region.

5. A semiconductor device fabrication method of claim 1, further comprising the steps of: forming an interlayer insulating film, opening a contact hole, forming a metal interconnection and forming a protection film.

6. A semiconductor device fabrication method, comprising the steps of:
   (i) forming a plurality of high concentration diffusion layers of a second conductivity in a semiconductor substrate;
   (ii) forming a plurality of first gate electrodes extending perpendicularly to the high concentration diffusion layers of the second conductivity on the semiconductor substrate with a first gate insulating film interposed therebetween;
   (iii) implanting ions of a first conductivity into surface portions of the semiconductor substrate for device isolation by using the first gate electrodes as a mask;
   (iv) forming side wall spacers on side walls of the first gate electrodes;
   (v-i) implanting ions of the second conductivity into surface portions of the semiconductor substrate for formation of channel regions by using the first gate electrodes and the side wall spacers as a mask;
   (v-ii) forming a mask having openings at least in ROM data writing areas below the first gate electrodes or second gate electrodes to be formed in the subsequent step and in device isolation region formation areas, and implanting ions of the first conductivity into surface portions of the semiconductor substrate for ROM data writing and for device isolation with the use of the mask; and (vi-i) forming a plurality of second gate electrodes on the ion-implanted channel regions between the first gate electrodes with a second gate insulating film interposed therebetween.

7. A semiconductor device fabrication method of claim 6, wherein the high concentration diffusion layers are formed rectangular and parallel to each other in the step (i).

8. A semiconductor device fabrication method of claim 6, wherein a mask pattern which covers regions unnecessary to be ion-implanted is additional used as well as the first gate electrodes as a mask in the step (iii).

9. A semiconductor device fabrication method of claim 6, wherein the ion-implantation in the step (v-i) cancels out the ions of the first conductivity implanted for the device isolation in the step (iii) so as to function the surface portions of the semiconductor substrate as a channel region.

10. A semiconductor device fabrication method of claim 6, wherein the mask to be used in the step (v-ii) has openings in ROM data writing areas below the second gate electrodes to be formed in the subsequent step and in the device isolation region formation areas, and the ions are implanted into surface portions of the semiconductor substrate not covered with the mask at an implantation energy which does not allow the ions to penetrate the first gate electrodes for the ROM data writing and for the device isolation in the step (v-ii).

11. A semiconductor device fabrication method of claim 6, wherein the mask to be used in the step (v-ii) has openings at least in ROM data writing areas below the first gate electrodes and in the device isolation region formation areas, and the ions are implanted into surface portions of the semiconductor substrate under the first gate electrodes at an implantation energy which allows the ions to penetrate the first gate electrodes for the ROM data writing, and into surface portions of the semiconductor substrate not covered with the mask at an implantation energy which does not allow the ions to penetrate the first gate electrodes for the device isolation.

12. A semiconductor device fabrication method of claim 6, further comprising the steps of: forming an interlayer insulating film, opening a contact hole, forming a metal interconnection and forming a protection film.

13. A semiconductor device fabrication method, comprising the steps of:

(i) forming a plurality of high concentration diffusion layers of a second conductivity in a semiconductor substrate;

(ii) forming a plurality of first gate electrodes extending perpendicularly to the high concentration diffusion layers of the second conductivity on the semiconductor substrate with a first gate insulating film interposed therebetween;

(iii) implanting ions of a first conductivity into surface portions of the semiconductor substrate for device isolation by using the first gate electrodes as a mask;

(iv) forming side wall spacers on side walls of the first gate electrodes;

(v-i) implanting ions of the second conductivity into surface portions of the semiconductor substrate for formation of channel regions by using the first gate electrodes and the side wall spacers as a mask;

(vi-i) forming a plurality of second gate electrodes on the ion-implanted channel regions between the first gate electrodes with a second gate insulating firm interposed therebetween; and (vi-ii) forming a mask having openings in at least one of ROM data writing area below the first gate electrodes and ROM data writing area below the second gate electrodes and in device isolation region formation areas, and implanting ions of the first conductivity into surface portions of the semiconductor substrate for ROM data writing and for device isolation with the use of the mask.

14. A semiconductor device fabrication method of claim 13, wherein the high concentration diffusion layers are formed rectangular and parallel to each other in the step (i).

15. A semiconductor device fabrication method of claim 13, wherein a mask pattern which covers regions unnecessary to be ion-implanted is additional used as well as the first gate electrodes as a mask in the step (iii).

16. A semiconductor device fabrication method of claim 13, wherein the ion-implantation in the step (v-i) cancels out the ions of the first conductivity implanted for the device isolation in the step (iii) so as to function the surface portions of the semiconductor substrate as a channel region.

17. A semiconductor device fabrication method of claim 13, wherein the first gate electrodes and the second gate electrodes are formed to have the same ion implantation preventing abilities.

18. A semiconductor device fabrication method of claim 13 wherein, in the step (vi-ii), the ions are implanted into surface portions of the semiconductor substrate under the first gate electrodes or the second gate electrodes with the use of the mask at an implantation energy which allows the ions to penetrate the first gate electrodes or the second gate electrodes for the ROM data writing, and implanted into surface portions of the semiconductor substrate not covered with the mask at an implantation energy which allows the ions to penetrate neither the first gate electrodes nor the second gate electrodes for the device isolation.

19. A semiconductor device fabrication method of claim 13, further comprising the steps of: forming an interlayer insulating film, opening a contact hole, forming a metal interconnection and forming a protection film.

* * * * *